(12) United States Patent
Kim et al.

(10) Patent No.: US 8,580,588 B2
(45) Date of Patent: Nov. 12, 2013

(54) ORGANIC LIGHT EMITTING DISPLAY DEVICE AND FABRICATING METHOD THEREOF

(75) Inventors: Jongyun Kim, Yongin-si (KR); Byoungdeog Choi, Yongin-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 12 days.

(21) Appl. No.: 13/408,919

(22) Filed: Feb. 29, 2012

(65) Prior Publication Data

US 2012/0156813 A1    Jun. 21, 2012

Related U.S. Application Data

(62) Division of application No. 11/785,043, filed on Apr. 13, 2007, now Pat. No. 8,148,719.

(30) Foreign Application Priority Data

Nov. 30, 2006 (KR) .................. 10-2006-0120208

(51) Int. Cl.
*H01L 51/56* (2006.01)

(52) U.S. Cl.
USPC ............... 438/27; 257/E21.259; 257/E21.502

(58) Field of Classification Search
USPC .......... 257/40, E21.259, E21.502; 438/23, 27
See application file for complete search history.

(56) References Cited

U.S. PATENT DOCUMENTS

| | | | |
|---|---|---|---|
| 4,735,847 A | 4/1988 | Fujiwara et al. | |
| 5,504,605 A | 4/1996 | Sakuma et al. | |
| 5,811,866 A | 9/1998 | Hirata | |
| 5,986,401 A | 11/1999 | Thompson et al. | |
| 6,559,594 B2 | 5/2003 | Fukunaga et al. | |
| 6,815,240 B2 | 11/2004 | Hayashi | |
| 7,083,863 B2 | 8/2006 | Satou et al. | |
| 7,223,636 B2 | 5/2007 | Kobayashi et al. | |
| 7,276,291 B2 | 10/2007 | Bright | |
| 2001/0011868 A1 | 8/2001 | Fukunaga et al. | |
| 2003/0010062 A1 | 1/2003 | Matthies | |
| 2003/0020124 A1 | 1/2003 | Guenther | |

(Continued)

FOREIGN PATENT DOCUMENTS

| CN | 1450837 | 10/2003 |
|---|---|---|
| EP | 1584971 | 10/2005 |

(Continued)

OTHER PUBLICATIONS

European Examination Report issued by European Patent Office on Oct. 25, 2012 corresponding to European Patent Application No. 07252153.7.

(Continued)

*Primary Examiner* — Thomas L Dickey (74) *Attorney, Agent, or Firm* — Robert E. Bushnell, Esq.

(57) ABSTRACT

An organic light emitting display includes a substrate, a semiconductor layer arranged on the substrate, an organic light emitting diode arranged on the semiconductor layer, an encapsulant arranged on an top surface periphery of the substrate, which is an outer periphery of the semiconductor layer and the organic light emitting diode, an encapsulation substrate bonded to the encapsulant, and a bonding agent arranged on an under surface of the substrate which is opposite to the encapsulant.

20 Claims, 8 Drawing Sheets

(56) References Cited

U.S. PATENT DOCUMENTS

| | | |
|---|---|---|
| 2003/0082889 A1 | 5/2003 | Maruyama et al. |
| 2003/0094894 A1 | 5/2003 | Andry et al. |
| 2003/0107326 A1 | 6/2003 | Park et al. |
| 2003/0155860 A1 | 8/2003 | Choi et al. |
| 2004/0129960 A1 | 7/2004 | Maruyama et al. |
| 2004/0135148 A1 | 7/2004 | Lin |
| 2004/0135164 A1 | 7/2004 | Park et al. |
| 2004/0178723 A1 | 9/2004 | Yasukawa et al. |
| 2004/0191963 A1 | 9/2004 | Pichler |
| 2004/0251827 A1 | 12/2004 | Kang et al. |
| 2004/0253838 A1 | 12/2004 | Yamazaki et al. |
| 2005/0002081 A1 | 1/2005 | Beteille et al. |
| 2005/0029926 A1 | 2/2005 | Park et al. |
| 2005/0045917 A1 | 3/2005 | Yamazaki et al. |
| 2005/0046340 A1 | 3/2005 | Kohara et al. |
| 2005/0046783 A1 * | 3/2005 | Kawata et al. ............... 349/187 |
| 2005/0067945 A1 | 3/2005 | Nishikawa et al. |
| 2005/0067950 A1 | 3/2005 | Nonoue et al. |
| 2005/0101052 A1 | 5/2005 | Kobayashi et al. |
| 2005/0164470 A1 | 7/2005 | Yamazaki et al. |
| 2005/0211990 A1 | 9/2005 | Lee et al. |
| 2005/0218409 A1 | 10/2005 | Um et al. |
| 2005/0285522 A1 | 12/2005 | Han et al. |
| 2007/0048895 A1 | 3/2007 | Suginoya et al. |
| 2008/0111125 A1 | 5/2008 | Kim et al. |
| 2008/0111126 A1 | 5/2008 | Kim et al. |
| 2008/0111477 A1 | 5/2008 | Kim et al. |
| 2008/0128683 A1 | 6/2008 | Kim et al. |
| 2008/0142791 A1 | 6/2008 | Kim et al. |

FOREIGN PATENT DOCUMENTS

| | | | |
|---|---|---|---|
| JP | 1984-17810 | | 4/1984 |
| JP | 09-211482 | | 8/1997 |
| JP | 2000-150145 | A | 5/2000 |
| JP | 2000-298264 | | 10/2000 |
| JP | 2001-053290 | | 2/2001 |
| JP | 2002-350833 | | 12/2002 |
| JP | 2003-173872 | | 6/2003 |
| JP | 2003-282235 | | 10/2003 |
| JP | 2004-170910 | | 6/2004 |
| JP | 2004-205601 | | 7/2004 |
| JP | 2005-071693 | | 3/2005 |
| JP | 2005-085705 | | 3/2005 |
| JP | 2005-222789 | | 8/2005 |
| JP | 2005-222930 | | 8/2005 |
| JP | 2005-284252 | | 10/2005 |
| JP | 2005-340011 | A | 12/2005 |
| JP | 2005-340168 | | 12/2005 |
| JP | 2005-340182 | | 12/2005 |
| JP | 2006-058814 | A | 3/2006 |
| JP | 2006-270511 | A | 10/2006 |
| JP | 2007-122984 | | 5/2007 |
| JP | 2008-141151 | | 6/2008 |
| KR | 10-2003-0009913 | | 2/2003 |
| KR | 10-2003-0054777 | | 7/2003 |
| KR | 10-2003-0069434 | | 8/2003 |
| KR | 10-2004-0010186 | | 1/2004 |
| KR | 10-2004-0106808 | | 12/2004 |
| KR | 10-2005-0012958 | | 2/2005 |
| KR | 10-2005-0029826 | | 3/2005 |
| KR | 10-2005-0051646 | | 6/2005 |
| KR | 10-2005-0059259 | | 6/2005 |
| KR | 10-2005-0064352 | | 6/2005 |
| KR | 10-2006-0089638 | | 8/2006 |
| KR | 10-2006-0099743 | | 9/2006 |
| KR | 10-20060124940 | | 12/2006 |
| KR | 10-2007-0014494 | | 2/2007 |
| KR | 10-2007-0047633 | | 5/2007 |
| WO | 2004075607 | | 9/2004 |
| WO | 2005/093700 | A2 | 10/2005 |

OTHER PUBLICATIONS

Avis relatif au rapport de recherche europeenne, filed Mar. 19, 2008 (Cited in Office action (Paper No. 20100314) mailed on Mar. 18, 2010 of the parent U.S. Appl. No. 11/785,043, filed Apr. 13, 2007).

European Extended Search Report issued by EPO on Nov. 2, 2010 in European Patent Application No. 07252164.4 corresponding to Cross-referenced U.S. Appl. No. 11/785,101 (Cited in IDS filed on Jan. 19, 2011 of the parent U.S. Appl. No. 11/785,043, filed Apr. 13, 2007).

Japanese Notice of Allowance issued by JPO on Jan. 25, 2011 in Japanese Patent Application No. 2007-109771 corresponding to Cross-referenced U.S. Appl. No. 11/785,098 (Cited in IDS filed on Apr. 25, 2011 of the parent U.S. Appl. No. 11/785,043, filed Apr. 13, 2007).

Japanese Office action cited in the IDS filed on 8 Jul. 2013 of the cross-referenced U.S. Appl. No. 11/785,099.

* cited by examiner

ORGANIC LIGHT EMITTING DISPLAY DEVICE AND FABRICATING METHOD THEREOF

CROSS-REFERENCE TO RELATED APPLICATIONS AND CLAIM OF PRIORITY

This application is a divisional application of the prior application Ser. No. 11/785,043 filed in the U.S. Patent & Trademark Office on 13 Apr. 2007 and assigned to the assignee of the present invention. Furthermore, this application makes reference to, incorporates the same herein, and claims all benefits accruing under 35 U.S.C. §119 from an application for ORGANIC LIGHT EMITTING DISPLAY AND FABRICATING METHOD THEREOF earlier filed in the Korean Intellectual Property Office on 30 Nov. 2006 and there duly assigned Serial No. 10-2006-0120208.

BACKGROUND OF THE INVENTION

1. Field of the Invention

The present invention relates to an organic light emitting display and fabricating method thereof, and more particularly, the present invention relates to an organic light emitting display and fabricating method capable of fabricating a thin organic light emitting display, shortening fabricating process time and preventing a substrate from being bent or damaged during the fabricating process.

2. Description of the Related Art

Generally, an organic light emitting display self-emits light by causing an electric current to flow through a fluorescent or phosphorescent organic compound and allowing an electron and a hole to be coupled to each other. Moreover, an organic light emitting display can display an image by driving organic light emitting diodes, for example, n by m organic light emitting diodes, by a voltage or a current.

Figure 1:
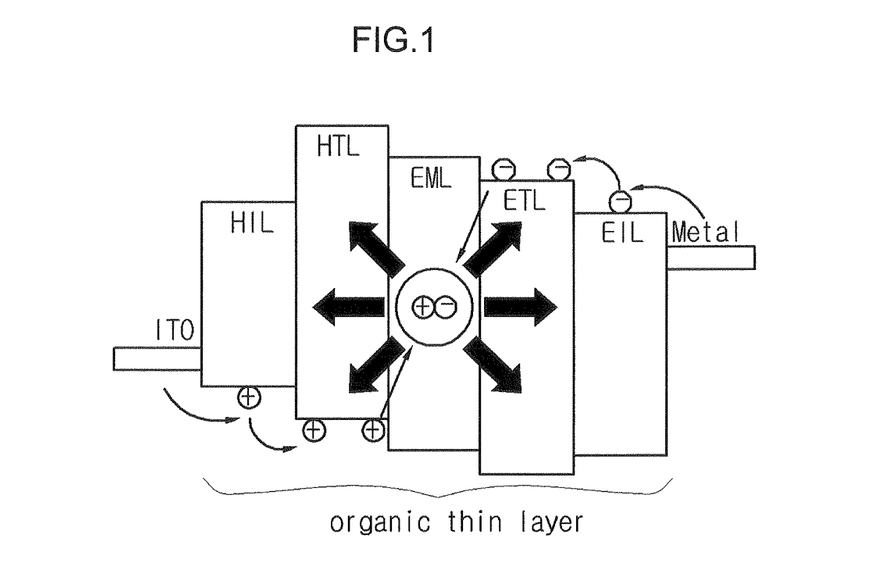
FIG. 1 is a schematic view of an organic light emitting diode.

As illustrated in FIG. 1, organic light emitting diodes have a basic structure including an anode (ITO), an organic thin layer and a cathode electrode (metal). The organic thin layer is composed of an EMitting Layer (EML) which emits light when the electrons and the holes meet and thereby form an exciton, an Electron Transport Layer (ETL) for controlling the moving speed of the electrons, and a Hole Transport Layer (HTL) for controlling the moving speed of the holes. An Electron Injecting Layer (EIL) is further formed in the ETL for improving the effectiveness of the injection of electrons, and, a Hole Injecting Layer (HIL) is further formed in the Hole Transport Layer for improving the effectiveness of the injection of holes.

The organic light emitting display is by no means inferior to other devices because of a wide range of vision, a super high-speed response, and spontaneous light emitting, and it is possible to fabricate a thin light-weight device since the power consumption is low and a backlight is not required. Since it is fabricated at a low temperature and the fabricating processes are simple, the device is fabricated at a low cost. As an organic thin layer material technology and the process technology are being developed rapidly, they are considered to be the technology which can replace the conventional flat display device.

Meanwhile, since electronic devices, such as cellular telephones, Personal Digital Assistants (PDAs), notebook computers, computer monitors, televisions and so forth, have becomes slimmer, it is necessary for the organic light emitting display to have a thickness below about 1 mm. However, in the present organic light emitting displays, since a protective layer technology that can substitute for an encapsulation technology has not been sufficiently developed, it is difficult to fabricate an organic light emitting display having a thickness below 1 mm.

In order to fabricate the organic light emitting display having a thickness below 1 mm, Japanese Laid-Open Patent Publications Nos. 2005-340182, 2005-222930 and 2005-222789 relate to a method of fabricating a thin organic light emitting display in which element layers (a semiconductor layer and an organic light emitting diode, etc.) are respectively formed on two glass substrates, and the glass substrates are then bonded to each other so that the respective element layers face each other and then the surfaces on which the element layers are not formed are removed by an etching or grinding process.

However, the above-noted fabricating method has a problem in that the fabricating process time greatly increases because after the semiconductor layer or the organic light emitting diode is formed on the respective glass substrates, the glass substrates are bonded to each other and are etched or ground. Moreover, such a conventional fabricating method has a problem in that the yield of production is low and the fabricating cost is expensive because the partly finished glass substrates are bonded to each other and the glass substrate, the semiconductor layer and the organic light emitting diode is damaged during bonding process.

A fabricating method is conceivable in which after providing a glass substrate having a thickness below 1 mm, an element layer is formed on the surface of the glass substrate. However, such a fabricating method has a problem in that the glass substrate bends or contacts a moving device and is damaged during the moving process because the glass substrate is very thin.

SUMMARY OF THE INVENTION

The present invention is conceived to solve the aforementioned problems, and it is an object of the present invention to provide a thin organic light emitting display.

Another object of the present invention is to shorten the fabricating process time by bonding two substrates.

Another object of the present invention is to generate no defective exposure by preventing UV-rays from impinging upon an undesired portion of the substrate.

Another object of the present invention is to prevent a substrate from being bent or damaged during the fabricating process.

To achieve the above described objects, an organic light emitting display according to the present invention can include a substrate, a semiconductor layer formed on the substrate, an organic light emitting diode formed on the semiconductor layer, an encapsulant formed on a top surface periphery of the substrate, which is an outer periphery of the semiconductor layer and the organic light emitting diode, an encapsulation substrate bonded to the encapsulant, and a bonding agent formed on a under surface of the substrate which is opposite to the encapsulant.

The bonding agent can be formed near at least on one side of the under surface of a substrate.

The bonding agent can be formed on the under surface of the substrate corresponding to the outer periphery of the semiconductor layer and the organic light emitting diode.

The bonding agent can be formed on the under surface of the substrate corresponding to the outer periphery of the encapsulant and the encapsulation substrate.

The substrate can be formed to have a bigger area than that of the encapsulation substrate.

The bonding agent can be at least one of an epoxy adhesive and a UV-ray setting adhesive.

The bonding agent can be formed to have a thickness in a range of 10 μm to 100 μm.

The substrate can be formed to have a thickness in a range of 0.05 mm to 1 mm.

The substrate can be formed of a glass, plastic, or polymer and steel.

A non-transmissive layer can be further formed on the under surface of the substrate.

A non-transmissive layer having a thickness in a range of 500~3000 Å can be further formed on the under surface of the substrate.

A non-transmissive layer made of one of a metal through which UV-rays are blocked, a transparent UV-ray protective agent, or an opaque UV-ray protective agent can be further formed on the under surface of the substrate.

A non-transmissive layer made of one of Cr, $Cr_2O_3$, Al, Au, Ag, MgO or a silver alloy can be further formed on the under surface of the substrate.

A non-transmissive layer and a magnetic layer can be further formed on the under surface of the substrate in sequence.

A non-transmissive layer, the magnetic layer and an anti-friction layer can be further formed on the under surface of the substrate in sequence.

A non-transmissive layer and an anti-friction layer can be further formed on the under surface of the substrate in sequence.

An anti-friction layer can be formed to have a thickness in a range of 10 μm to 100 μm.

An anti-friction layer can be formed of either an organic material or an inorganic material.

A buffer layer can be formed on the under surface of the semiconductor layer, a gate insulating layer can be formed on the top surface of the semiconductor layer, a gate electrode can be formed on the top surface of the gate insulating layer, an inter-layer dielectric layer can be formed on the gate electrode, a source/drain electrode can be formed on the inter-layer dielectric layer, an insulating layer can be formed on the source/drain electrode, and an organic light emitting diode can be formed on the insulating layer.

A driver circuit can be further formed on the outer periphery of the semiconductor layer of the top surface of the substrate.

To achieve the above described objects, a method of fabricating an organic light emitting display according to the present invention can include preparing substrate; forming an non-transmissive layer on the under surface of the substrate; bonding two substrates together by applying a bonding agent with the non-transmissive layers facing each other; forming a semiconductor layer on the surface of the bonded substrate opposite to the non-transmissive layer respectively; forming an organic light emitting diode on the respective semiconductor layer; attaching an encapsulation substrate on the surface of the substrate, in which the respective light emitting element is formed, by applying an encapsulant to the surface; leaving the bonding agent on the substrate while sawing the region of the substrate corresponding to the outer periphery of the encapsulation substrate; and separating the two bonded substrates into the respective substrate.

Bonding the substrates can be achieved by using either an epoxy adhesive or a UV-ray setting adhesive as a bonding agent.

Bonding the substrates can be achieved by applying a bonding agent to the edge of the substrate.

Bonding the substrates can be achieved by applying a bonding agent to a region of the substrate corresponding to the outer periphery of the semiconductor layer and the organic light emitting diode.

Bonding the substrates can be achieved by applying a bonding agent to a region of the substrate corresponding to the outer periphery of the encapsulant.

Preparing the substrate can be achieved by preparing the substrate to have a thickness in a range of 0.05 to 1 mm.

Preparing the substrate can be achieved by making the substrate of a glass, plastic, or a polymer and steel.

Forming the non-transmissive layer can be achieved by forming the non-transmissive layer to have a thickness in a range of 500 to 3000 Å on the under surface of the substrate.

Forming the non-transmissive layer can be achieved by coating a UV-ray protective agent on the under surface of the substrate.

Forming the non-transmissive layer can be achieved by forming the non-transmissive layer of one of a metal through which UV-rays are blocked, a transparent UV-ray protective agent, or an opaque UV-ray protective agent on the under surface of the substrate.

Forming the non-transmissive layer can be achieved by forming the non-transmissive layer of one of Cr, $Cr_2O_3$, Al, Au, Ag, MgO or a silver alloy on the under surface of the substrate.

Forming the non-transmissive layer can be achieved by further forming a magnetic layer on the under surface of the substrate.

Forming the non-transmissive layer can be achieved by further forming an anti-friction layer on the under surface of the magnetic layer.

Forming the non-transmissive layer can be achieved by further forming the anti-friction layer on the under surface of the substrate.

Forming the non-transmissive layer can be achieved by further forming the anti-friction layer to have a thickness in a range of 10 to 100 μm on the under surface of the substrate.

Forming the non-transmissive layer can be achieved by further forming the anti-friction layer of either an organic material or an inorganic material on the under surface of the substrate.

Bonding the substrates can be achieved by making the anti-friction layers formed on the respective substrate contact each other.

Attaching of the encapsulation substrate can be achieved by making the area of the encapsulation substrate smaller than that of the substrate.

The step of sawing can be achieved by a laser beam.

After separating the substrates, removing the non-transmissive layer can be further performed.

Forming a semiconductor layer can be achieved by further forming a driver circuit on one side of the semiconductor layer.

In accordance with the above, the organic light emitting display according to the present invention can be easily applied to electronic devices, such as cellular telephones, Personal Digital Assistants (PDAs), notebook computers, computer monitors and televisions, by being made in a thin and compact size.

In accordance with the above, the organic light emitting display according to the present invention prevents UV-rays from influencing the semiconductor layer or the organic light emitting diode through the substrate by forming the non-transmissive layer on the substrate.

In accordance with the above, the organic light emitting display according to the present invention prevents the substrate from being damaged due to external forces as rigidity is increased by forming the encapsulant on one side of the under surface of the substrate.

The method of fabricating the organic light emitting display according to the present invention can shorten the overall process time by about 50% as the semiconductor process and the organic thin layer process (including cleaning, etching, exposure, development and heat treatment) are executed simultaneously by bonding two substrates having a thickness of 0.05 to 1 mm, and preventing the substrate from being bent by means of obtaining a specific rigidity.

In accordance with the above, the fabricating method according to the present invention prevent UV-rays due to the exposure process from influencing the other substrate on the opposite side during the fabricating process by forming the non-transmissive layer on the under surface of the substrate.

In accordance with the above, the fabricating method according to the present invention prevents the organic light emitting display from being bent or damaged due to the repulsion force between the magnetic layer and the transporting machine transporting the magnetic layer (an another magnetic layer repulsive to the magnetic layer is formed on the transporting machine) or the force of gravity during fabricating process as rigidity is increased by forming the non-transmissive layer/magnetic layer on the under surface of the substrate.

In accordance with the above, the fabricating method according to the present invention prevents the substrates from contacting each other, and thus, from being damaged by forming the non-transmissive layer/magnetic layer/anti-friction layer or the non-transmissive layer/anti-friction layer on the under surface of the substrate.

BRIEF DESCRIPTION OF THE DRAWINGS

A more complete appreciation of the present invention and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Hereinafter, the present invention is described in more detail below with reference to the accompanying drawings, so that a person of ordinarily skill in the art will understand the present invention without difficulty.

Referring to FIGS. 2a-2d, a cross-sectional view of an organic light emitting display according to an embodiment of the present invention is illustrated.

As illustrated in FIGS. 2a-2d, an organic light emitting display 101 according to the present invention includes a substrate 110, a semiconductor layer 130 formed on the substrate 110, a driver circuit 139 formed on one side of the semiconductor layer 130, an organic light emitting diode 190 formed on the semiconductor layer 130, a encapsulant 240 formed on a top surface periphery of the substrate 110, which is an outer periphery of the semiconductor layer 130, the organic light emitting diode 190 and the driver circuit 139, an encapsulation substrate 250 bonded to the encapsulant 240, and a bonding agent 260 formed on a under surface of the substrate 110 which is opposite to the encapsulant 240.

The bonding agent can be at least one of an epoxy adhesive, an UV-ray setting adhesive, a frit or an equivalent thereof. However, the material is not restricted thereto. If a frit is used as the encapsulant 240, an encapsulating operation can be executed by using a laser beam because the frit must be heated to a predetermined temperature. After arranging the frit between the substrate 110 and the encapsulation substrate 250, if the laser beam radiates the frit, then the frit melts and the substrate 110 and the encapsulation substrate 250 are strongly attached each other.

The encapsulation substrate 250 can be formed of a transparent glass, a transparent plastic, a transparent polymer or an equivalent thereof. However, the material is not restricted thereto.

The bonding agent 260 is formed during a fabricating process of the organic light emitting display according to an embodiment of the present invention, and reinforces the strength of the substrate.

The bonding agent 260 can be formed in the vicinity of at least on one side of the under surface of the substrate 110. The bonding agent 260 can be formed in the vicinity of every edge of the under surface of the substrate 110. The bonding agent 260 can be formed on the under surface of the substrate 110 corresponding to the outer periphery of the semiconductor layer 130 and the organic light emitting diode 190. The bonding agent 260 can be formed on the under surface of the substrate 110 corresponding to the outer periphery of the encapsulant 240 and the encapsulation substrate 250.

The bonding agent 260 can be formed of at least one of an epoxy adhesive, a UV-ray setting adhesive or an equivalent thereof. However, the material of the bonding agent 260 is not restricted thereto.

The bonding agent 260 can be formed to have a thickness of about 10 to 100 μm. If the thickness of the bonding agent is 10 μm or below, the rigidity is weak when two substrates contact to each other during the fabricating process, and if the thickness of the bonding agent is 100 μm or above, the bonded substrates are too thick. As described above, in order to arrange the bonding agent 260 on the outer periphery of the semiconductor layer 130, the organic light emitting diode 190, the encapsulant 240 and the encapsulation substrate 250, the substrate 110 must have a larger region than that of the encapsulation substrate 250. A non-transmissive layer 210 can be further formed on the under surface of the substrate 110 to prevent UV-rays from penetrating into the semiconductor layer 130 or the organic light emitting diode 190.

Figure 2A:
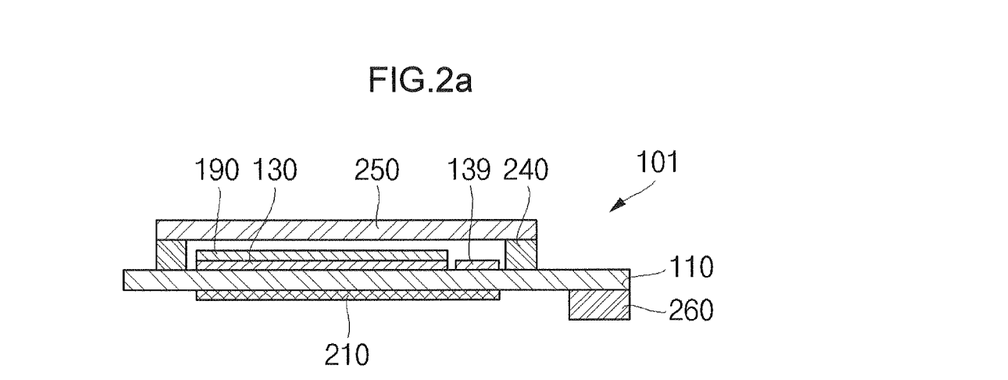
FIGS. 2a to 2d are cross-sectional views of an organic light emitting display according to an embodiment of the present invention.
Figure 2B:
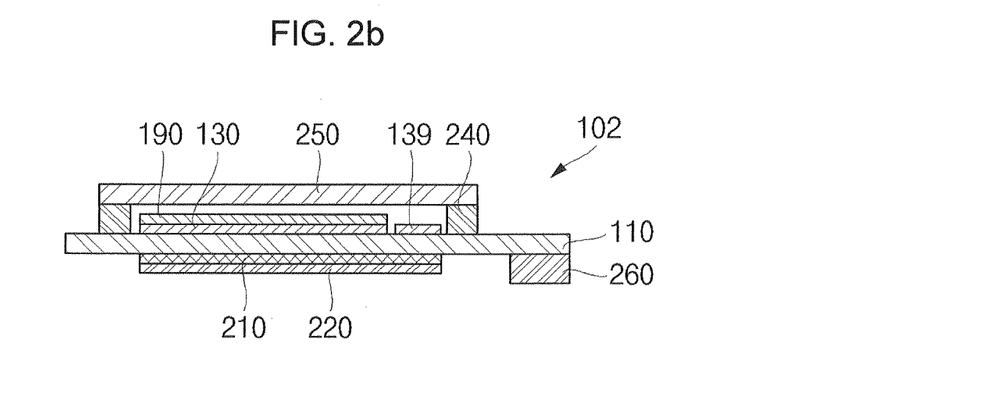

As illustrated in FIG. 2b, in the organic light emitting display 102 according to an embodiment of the present invention, the non-transmissive layer 210 and the magnetic layer 220 can be formed on the under surface of the substrate 110 in sequence.

Figure 2C:
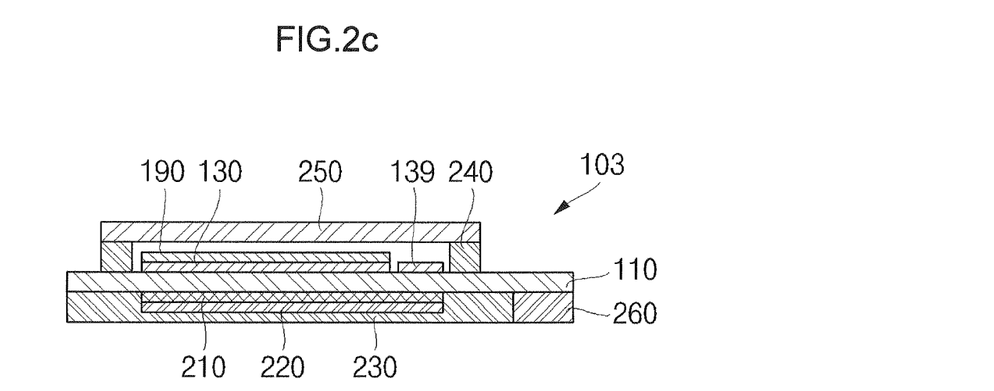

As illustrated in FIG. 2c, in the organic light emitting display 103 according to an embodiment of the present invention, the non-transmissive layer 210, the magnetic layer 220 and the anti-friction layer 230 can be formed on the under surface of the substrate 110 in sequence.

Figure 2D:
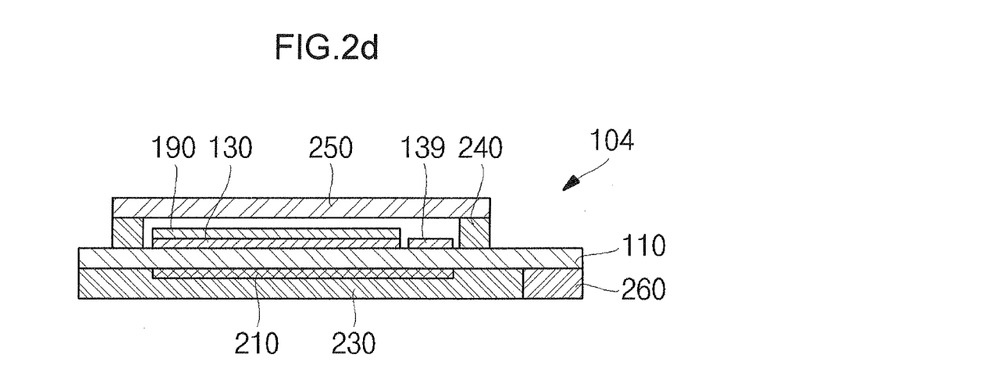

As illustrated in FIG. 2d, in the organic light emitting display 104 according to an embodiment of the present invention, the non-transmissive layer 210 and the anti-friction layer 230 can be formed on the under surface of the substrate 110 in sequence. As described above, the non-transmissive layer 210, the magnetic layer 220 and the anti-friction layer 230 are described in more detail below.

A transparent moisture absorption layer which is not illustrated in the drawings can be formed on the under surface of the encapsulation substrate 250. That is, the transparent moisture absorption layer which is able to absorb moisture without blocking light can be formed on the under surface of the encapsulation substrate 250, since the organic light emitting diode 190 is vulnerable to moisture. This transparent moisture absorption layer is more advantageous as it is getting thicker as long as the transparency is obtained. Typically, it is preferable that the thickness of transparent moisture absorption layer is in a range of 0.1 to 300 μm. If the thickness of the transparent moisture absorption layer is 0.1 μm or below, sufficient moisture absorption characteristic is not achieved, and if the thickness of the transparent moisture absorption layer is 300 μm or above, there is a risk that it can contact the organic light emitting diode 190. The transparent moisture absorption layer can be made of alkaline metallic oxide, alkaline earth metallic oxide, metallic halide, metallic sulfate, metallic perchlorate, $P_2O_5$ or an equivalent thereof having an average grain size of 100 nm or below, in particular 20 to 100 nm. However, the material is not restricted thereto.

According to the present invention, moisture can be absorbed by filling up the space between the substrate 110 and the encapsulation substrate 250 with at least one of layered inorganic substance, polymer, hardening agent or an equivalent thereof, instead of forming the transparent moisture absorption layer on the encapsulation substrate 250. After this filling, a heat treatment process is performed, so that these materials are hardened.

A light reflection effect due to external light can be prevented by arranging a polarizer film to the surface of the encapsulation substrate 250.

FIGS. 3a to 3d, are cross-sectional views of the organic light emitting display according to an embodiment of the present invention before the encapsulation substrate is encapsulated.

Figure 3A:
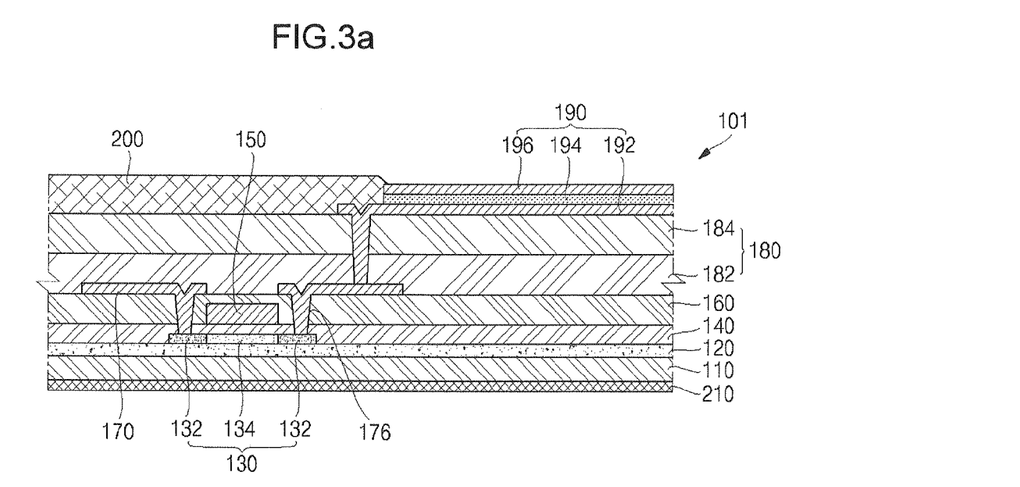
FIGS. 3a to 3d are cross-sectional views of an organic light emitting display according to an embodiment of the present invention before an encapsulation substrate is formed.

As illustrated in FIG. 3a, the organic light emitting display 101 can include a substrate 110, a buffer layer 120 formed on the substrate 110, a semiconductor layer 130 formed on the buffer layer 120, a gate insulating layer 140 formed on the semiconductor layer 130, a gate electrode 150 formed on the gate insulating layer 140, an inter-layer dielectric layer 160 formed on the gate electrode 150, a source/drain electrode 170 formed on the inter-layer dielectric layer 160, an insulating layer 180 formed on the source/drain electrode 170, an organic light emitting diode 190 formed on the insulating layer 180, and a pixel defining film 200 formed on the insulating layer 180 which is an outer periphery of the organic light emitting diode 190.

The top surface and the under surface of the substrate 110 are parallel to each other, and a thickness between the top and under surfaces can be formed to be 0.05 to 1 mm. If the thickness of the substrate 110 is 0.05 mm or below, the substrate is easily damaged by cleaning, etching or heat treatment processes, and is vulnerable to external forces. If the thickness the substrate 110 is 1 mm or above, it is impossible to apply the substrate to various thin display devices. The substrate 110 can be formed of a material selected from a typical glass, plastic, polymer or an equivalent thereof. However, the present invention is not restricted to these materials.

The buffer layer 120 can be formed on the top surface of the substrate 110. This buffer layer 120 prevents $H_2O$, $H_2$ or $H_2$, etc from infiltrating into the semiconductor layer 130 or the organic light emitting diode 190 through the substrate 110. The buffer layer 120 can be made of at least one material selected from $SiO_2$, $Si_3N_4$, or the equivalent thereof which are easily made during the semiconductor process. However, the present invention is not restricted thereto. This buffer layer 120 can be omitted, if necessary.

The semiconductor layer 130 can be formed on the top surface of the buffer layer 120. This semiconductor layer 130 includes source/drain regions 132 formed on both sides opposite to each other, and a channel region 134 formed between the source/drain regions 132. For example, the semiconductor layer 130 can be a thin film transistor. This thin film transistor can be at least one of an amorphous Si thin film transistor, poly Si thin film transistor, organic thin layer transistor, micro Si thin film transistor or the equivalent thereof. However, the present invention is not restricted to these thin film transistors. If the thin film transistor is the poly Si thin film transistor, the poly Si thin film transistor can be made according to at least one method including a crystallization method using a laser at low temperature, a crystallization method using a metal, a crystallization method using high pressure, or the equivalent thereof. However, the present invention is not restricted to these methods. The crystallization method using a laser can be Excimer Laser Annealing (ELA), Sequential Lateral Solidification (SLS), Thin Beam Direction Crystallization (TDX) and so on. However, the present invention is not restricted to these methods. The crystallization method using a metal can be Solid Phases Crystallization (SPC), Metal Induced Crystallization (MIC), Metal Induced Lateral Crystallization (MILC), Super Grained Silicon (SGS) and so on. However, the present invention is not restricted to these methods. The thin film resistor can be one of PMOS, NMOS or the equivalent thereof. However, the present invention is not restricted thereto.

The gate insulating layer 140 can be formed on the top surface of the semiconductor layer 130. This gate insulating layer 140 can be formed on the buffer layer 120 which is the outer periphery of the semiconductor layer 130. The gate insulating layer 140 can be made of at least one of a silicon oxide film, a silicon nitride film, an inorganic film or an equivalent thereof which are easily obtained during the semiconductor process. However, the material is not restricted thereto.

The gate electrode 150 can be formed on the top surface of the gate insulating layer 140. More specifically, the gate electrode 150 can be formed on the gate insulating layer 140 corresponding to the channel region 134 of the semiconductor layer 130. As known to those skilled in the art, this gate electrode 150 makes a hole or a channel of an electron in the channel region 134 by applying an electric field to the channel region 134 of the gate insulating layer 140. The gate electrode can be made of a typical metal (MoW, Ti, Cu, Al, AlNd, Cr, Mo alloy, Cu alloy, Al alloy, etc.), a doped poly silicon or the equivalent thereof. However, the material is not restricted thereto.

The inter-layer dielectric layer 160 can be formed on the top surface of the gate electrode 150. The inter-layer dielectric layer 160 can be formed on the top surface of the gate insulating layer 140 which is the outer periphery of the gate electrode 150. The inter-layer dielectric layer 160 can be formed of any one of polymers, plastics, glasses or the equivalent thereof. However, the material of the inter-layer dielectric layer 160 is not restricted thereto.

The source/drain electrode 170 can be formed on the top surface of the inter-layer dielectric layer 160. An electrically conductive contact 176, which penetrates into the inter-layer dielectric layer 160, can be formed between the source/drain electrode 170 and the semiconductor layer 130. That is, the source/drain regions 132 of the semiconductor layer 130 and the source/drain electrode 170 are electrically coupled by the electrically conductive contact 176. The source/drain electrode 170 can be formed of the same metal material as the gate electrode 150. However, the material is not restricted thereto. The above-described semiconductor layer 130 (the thin film transistor) is defined as a coplanar structure. However, the semiconductor layer 130 described in the present invention is not restricted to the coplanar structure, and can be any structure known hereto, for example, the structure can be at least one of an inverted coplanar structure, a staggered structure, an inverted staggered structure or an equivalent thereof. However, the semiconductor layer 130 of the present invention is not restricted thereto.

The insulating layer 180 can be formed on the top surface of the source/drain electrode 170. This insulating layer 180 can include a protective layer 182 and an planarization layer 184. The protective layer 182 covers the source/drain electrode 170 and the inter-layer dielectric layer 160, and protects the source/drain electrode 170, the gate electrode 150 and so on. This protective layer 182 can be formed of a typical inorganic film or an equivalent thereof. However, the material of the protective layer 182 is not restricted thereto. The planarization layer 184 covers the protective layer 182. This planarization layer 184 makes the entire surface of the element flat, and can be formed of at least one of a Benzo Cyclo Butene (BCB), an acrylic or an equivalent thereof. However, the material is not restricted thereto.

The organic light emitting diode 190 can be formed only on the top surface of the insulating layer 180. This organic light emitting diode 190 can include an anode 192, an organic light emitting thin film 194 formed on the top surface of the anode 192, and a cathode 196 formed on the top surface of the organic light emitting thin film 194. The anode 192 can be formed of Indium Tin Oxide (ITO)/Ag, ITO/Ag/ITO, ITO/Ag/Indium Zinc Oxide (IZO) or the equivalent thereof. However, the material of the anode 192 is not restricted thereto. The ITO is a transparent conductive layer in which a work function is uniform and a hole injecting barrier to the organic light emitting thin layer 194 is small, and the Ag is a layer that reflects the light emitted from the organic light emitting thin layer 194 to the top surface in a top emission system. The organic light emitting thin film 194 can include an EMitting Layer (EML) which is emitted as the exciton is formed by contact between electrons and holes, an electron transport layer (ETL) which controls the speed of electrons, and a Hole Transport Layer (HTL) which controls the speed of holes. An Electron Injection Layer (EIL) can be further formed on the ETL, and a Hole Injection Layer (HIL) can be further formed on the HTL. The cathode 196 can be at least one of Al, MgAg alloy, MgCa alloy or the equivalent thereof. However, the material of the cathode 196 of the present invention is not restricted thereto. If the top emission system is employed in the present invention, then the Al should be very thin. However, in this case, the resistance becomes high, and thus the electron injecting barrier becomes large. The MgAg alloy has an electron injecting barrier that is smaller than that of the Al, and the MgCa alloy has an electron injecting barrier that is smaller than that of the MgAg Alloy. However, the MgAg alloy and the MgCa alloy must be completely protected from the outside because they are sensitive to the surrounding environment and can oxidize and form an insulating layer. The anode 192 of the organic light emitting diode 190 and the source/drain electrode 170 can be electrically interconnected by an electrically conductive via 198 penetrating through the insulating layer 180 (the protective layer 182 and the planarization layer 184). Although the present invention has been described based on a top emission system in which the light is emitted in the direction of the upper part of the substrate 110, the present invention can be applied to a bottom emission system in which the light is emitted in the direction of the lower part of the substrate 110 or a dual emission system in which the light is simultaneously emitted in the directions of the upper and lower parts of the substrate 110.

The pixel defining film 200, as an outer periphery of the organic light emitting diode 190, can be formed on the top surface of the insulating layer 180. This pixel defining film 200 makes the boundary among a red organic light emitting diode, a green organic light emitting diode and a blue organic light emitting diode clear, and thus it makes the emitting boundary region between the pixels clear. This pixel defining film 200 can be formed of a polyimide or the equivalent thereof. However, the material of the pixel defining film 200 is not restricted thereto.

According to the present invention, the non-transmissive layer can be further formed on the under surface of the substrate 110. The non-transmissive layer 210 prevents UV-rays from impinging upon another substrate opposite to the UV-rays during the fabricating process which forms the semiconductor layer 130 and the organic light emitting diode 190 by bonding two substrates 110. The non-transmissive layer 190 prevents external UV-rays from impinging upon the semiconductor layer 130 and the organic light emitting diode 190 after the substrates 110 are divided into pieces. The non-transmissive layer 210 can be formed of a UV-ray protective agent or an equivalent thereof. The non-transmissive layer 210 can be formed of at least one of a metal through which UV-rays are blocked, a transparent UV-ray protective agent or an opaque UV-ray protective agent. If the non-transmissive layer 210 is a metal, then the non-transmissive layer can be formed of at least one of Cr, $Cr_2O_3$, Al, Au, Ag, MgO, a silver alloy or the equivalent thereof. However, the material is not restricted thereto. It is preferable that the non-transmissive layer 210 is formed to have a thickness of 500 to 3000 Å. If the thickness of the non-transmissive layer 210 is 500 Å or below, then the elimination rate of UV-rays is low, and thus the semiconductor layer 130 or the organic light emitting diode 190 is affected by the radiation during or after the fabricating process. If the thickness of the non-transmissive layer 210 is 3000 Å or above, then the elimination rate of UV-rays is good enough, but the non-transmissive layer 210 is too thick.

Figure 3B:
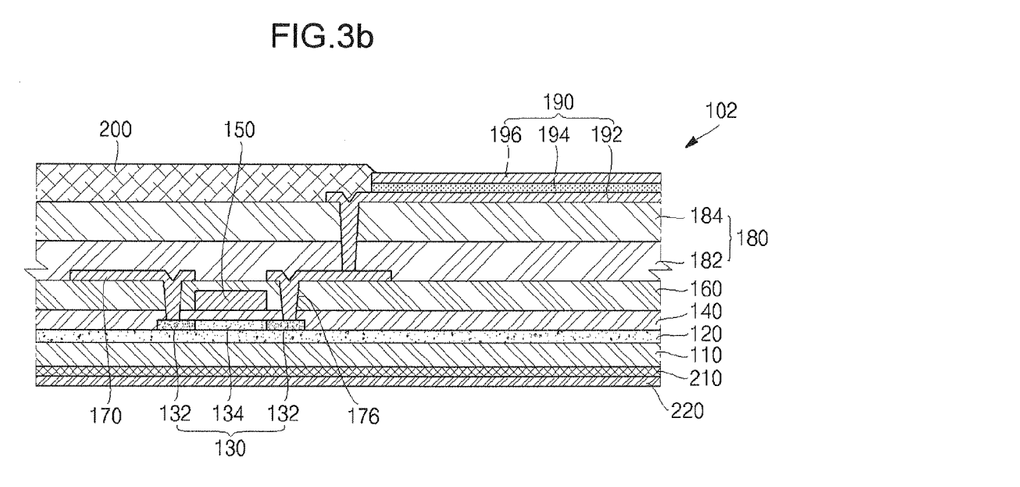

As illustrated in FIG. 3*b*, in the organic light emitting display 102 according to an embodiment of the present invention, the magnetic layer 220 can be further formed on the under surface of the non-transmissive layer 210. This magnetic layer 220 prevents the substrate 110 from being bent during the process forming of the semiconductor layer 130 and the organic light emitting diode 190 by bonding the two substrates 110. It is possible to prevent the substrate 110 from being bent by disposing a magnet with opposite polarity which repels the magnetic layer 220. This magnetic layer 220 can be formed of at least one of AlNiCo magnet, ferrite magnet, rare earth magnet, rubber magnet, plastic magnet or the equivalent thereof. However, the material of the magnetic layer 220 is not restricted thereto. According to the present invention, it is possible to replace the magnetic layer by forming a pattern of an electromagnet instead of the permanent magnet or mounting the electromagnet. It is preferable that the magnetic layer 220 has a thickness of 10 to 100 μm. If the magnetic layer 220 is 10 μm or below, then it is hard to get sufficient magnetic force, and if the magnetic layer 220 is 100 μm or above, the magnetic layer is too thick.

Figure 3C:
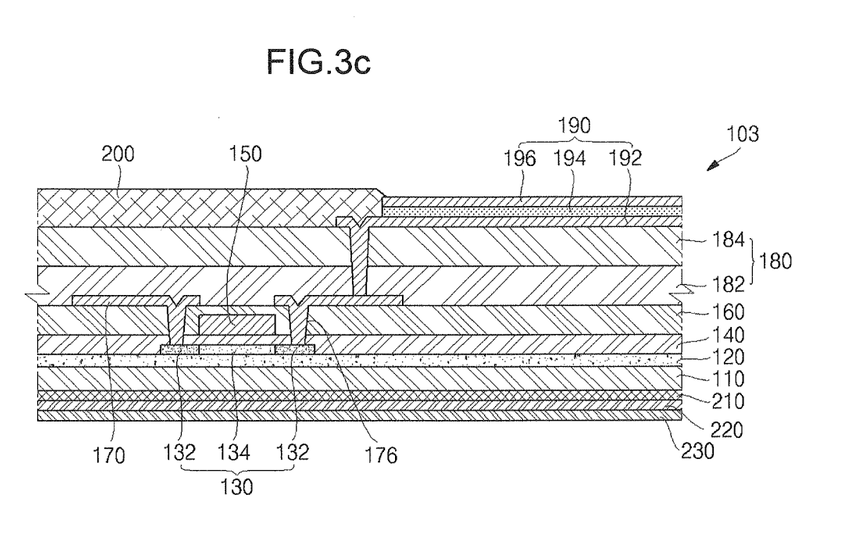

As illustrated in FIG. 3c, in the organic light emitting display 103 according to an embodiment of the present invention, the anti-friction layer 230 can be further formed on the under surface of the magnetic layer 220. This anti-friction layer 230 prevents two substrates 110 from contacting each other during the process which forms the semiconductor 130 and the organic light emitting diode 190 by bonding two substrates 110. It prevents the substrate 110 from being damaged as it prohibits the non-transmissive layer 210 or the magnetic layer formed on the both substrates from contacting each other. This anti-friction layer 230 can be formed of one of an organic material, an inorganic material or an equivalent thereof. However, the material is not restricted thereto. It is preferable that the anti-friction layer 230 is formed to have a thickness of 10 to 100 μm. If the thickness of the anti-friction layer 230 is 100 μm or below then the substrates can contact each other, and if the thickness of the anti-friction layer 230 is 100 μm or above, then the substrate 110 is too thick.

Figure 3D:
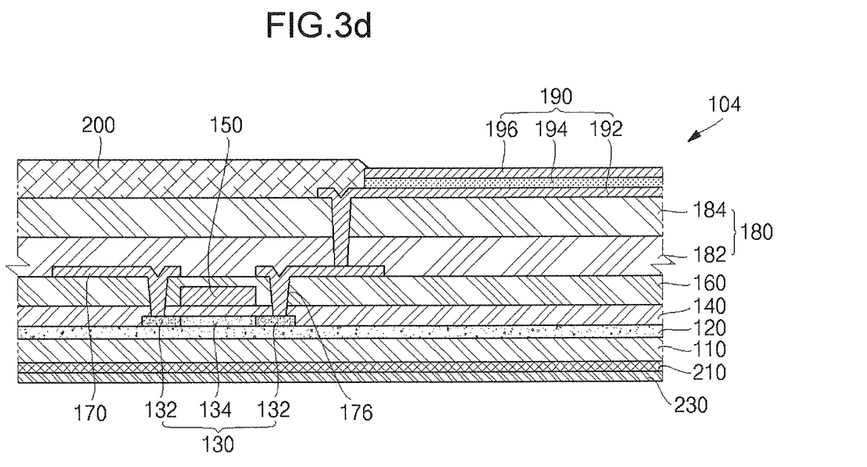

As illustrated in FIG. 3d, in the organic light emitting display 104 according to an embodiment of the present invention, the non-transmissive layer 210 and the anti-friction layer 230 can be formed on the under surface of the substrate 110 in sequence. The material and the thickness of the non-transmissive layer 210 and the anti-friction layer 230 have been omitted, since they are described above. In this embodiment, the magnetic layer 220 is omitted between the non-transmissive layer 210 and the anti-friction layer 230. This is only possible when there is a little possibility of bending during the fabricating process due the small area of the substrate 110. In an organic light emitting display 101 according to an embodiment of the present invention, it is possible to omit the magnetic layer 220. If the non-transmissive layer 210 and the anti-friction layer 230 are formed to be relatively thick within the permissible range, the substrate 110 is not bent during the fabricating processes due to the increased rigidity.

Figure 4:
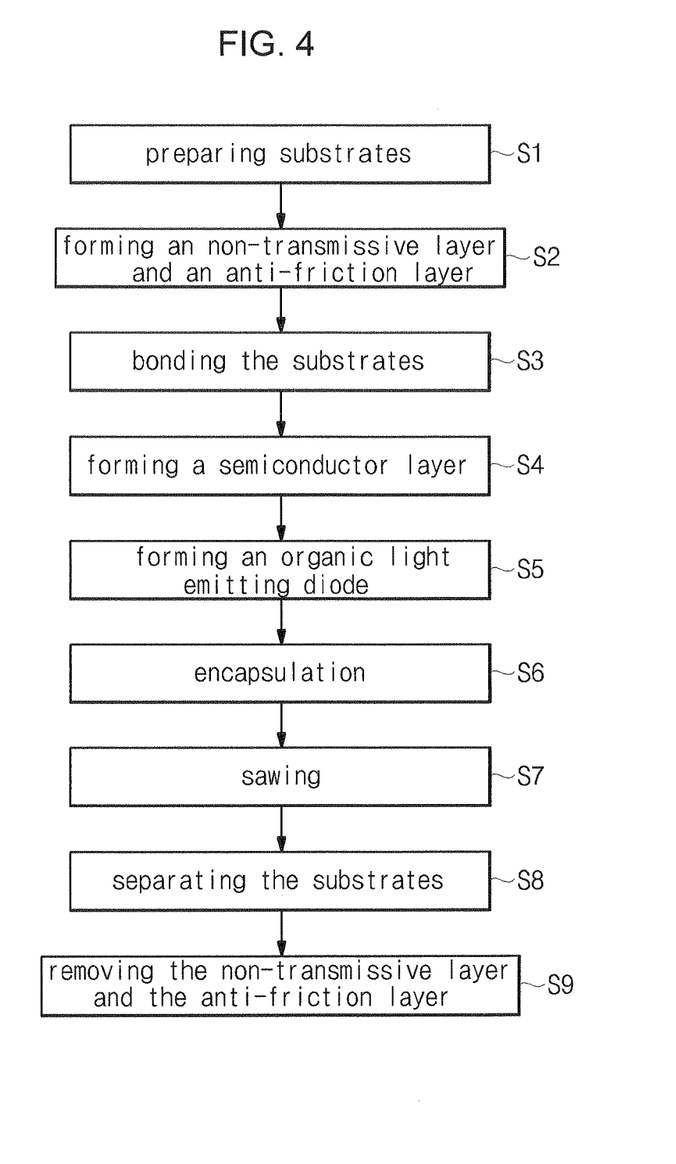
FIG. 4 is a flowchart of a method of fabricating an organic light emitting display according to an embodiment of the present invention.

FIG. 4, is a flowchart of the fabricating process of the organic light emitting display.

As illustrated in FIG. 4, a method of fabricating an organic light emitting display according to an embodiment of the present invention can include a step of preparing substrates (S1), a step of forming an non-transmissive layer (S2), a step of bonding the substrates (S3), a step of forming a semiconductor layer (S4), a step of forming an organic light emitting diode (S5), a step of encapsulating (S6), a step of sawing (S7), and a step of separating the substrates (S8). A method of fabricating an organic light emitting display according to an embodiment of the present invention can further include a step of removing the non-transmissive layer (S9).

FIGS. 5a to 5i, are cross-sectional views of a method of fabricating an organic light emitting display according to an embodiment of the present invention. The method of fabricating the organic light emitting display according to an embodiment of the present invention is described below with reference to FIG. 4 and FIGS. 5a to 5i.

Figure 5A:
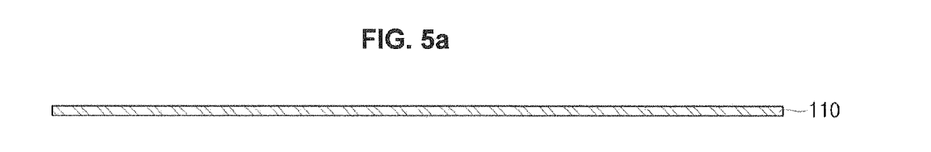
FIGS. 5a to 5i are cross-sectional views of a fabricating flow of an organic light emitting display according to an embodiment of the present invention.

In the step of preparing substrates (S1), as illustrated in FIG. 5a, substrates 110 having flat top and under surfaces and having a constant thickness are provided.

It is preferable that the thickness of the substrate is 110 is 0.05 to 1 mm. If the thickness of the substrate 110 is 0.05 mm or below, then the substrate is easily damaged by cleaning, etching and heat treatment processes, and is weak with respect to external forces. If the thickness of the substrate 110 is 1 mm or above, it is impossible to apply the substrate to various thin display devices. The substrate 110 can be formed of one of a glass, plastic, polymer and steel, or the equivalent thereof. However, the material or type of substrate 110 is not restricted thereto.

Figure 5B:
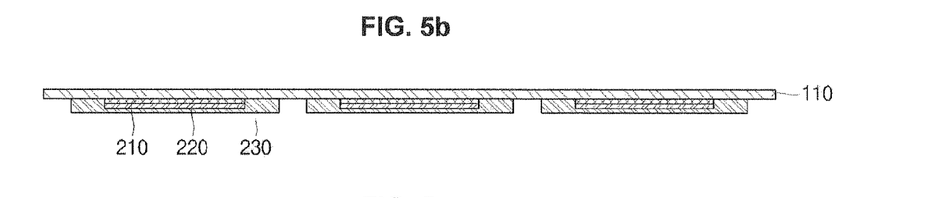

In the step of forming an non-transmissive layer (S2), as illustrated in FIG. 5b, the non-transmissive layer 210 having a predetermined thickness is formed on the under surface of the substrate 110.

The non-transmissive layer 210 prevents UV-rays for exposure from impinging upon the other substrate opposite to the UV-rays during the fabricating process that forms the semiconductor layer and the organic light emitting diode by bonding two substrates 110. The non-transmissive layer 210 prevents the external UV-rays from impinging upon the semiconductor layer and the organic light emitting diode after the substrates 110 are divided into pieces. The non-transmissive layer 210 can be formed of a UV-ray protective agent or the equivalent on the surface of the substrate 110. The non-transmissive layer 210 can be form by depositing or coating at least one of a metal through which UV-rays are blocked, a transparent UV-ray protective agent and an opaque UV-ray protective agent on the surface of the substrate 110. If the non-transmissive layer 210 is a metal, then the non-transmissive layer can be formed by depositing or coating at least one of Cr, $Cr_2O_3$, Al, Au, Ag, MgO, a silver alloy or the equivalent thereof on the surface of the substrate 110. It is preferable that the non-transmissive layer 210 is formed to have a thickness of 500 to 3000 Å. If the thickness of the non-transmissive layer 210 is 500 Å or below, then the elimination rate of UV-rays is low, and the semiconductor layer or the organic light emitting diode is affected by the radiation during or after the fabricating process. If the thickness of the non-transmissive layer 190 is 3000 Å or above, then the elimination rate of UV-ray is good enough. However, the non-transmissive layer 190 is too thick.

In the step of forming the non-transmissive layer (S2), the magnetic layer 220 can be formed on the under surface of the non-transmissive layer 210, or the magnetic layer 220 and the anti-friction layer 230 can be formed on the under surface of the non-transmissive layer 210, or the anti-friction layer 230 can be formed on the under surface of the non-transmissive layer 210.

The magnetic layer 220 prevents the substrate 110 from being bent during the process forming the semiconductor layer 130 and the organic light emitting diode 190 by bonding the two substrates 110. It is possible to prevent the substrate 110 from being bent by disposing a magnet with an opposite polarity which repels the magnetic layer 220. This magnetic layer 220 can be formed of at least one of an AlNiCo magnet, ferrite magnet, rare earth magnet, rubber magnet, plastic magnet or the equivalent thereof. However, the material of the magnetic layer 220 is not restricted thereto. According to the present invention, it is possible to replace the magnetic layer by forming a pattern of an electromagnet. It is preferable that the magnetic layer 220 has a thickness of 10 to 100 μm. If the magnetic layer 220 is 10 μm or below, it is hard to get sufficient magnetic force, and if the magnetic layer 220 is 100 μm or above, the magnetic layer is too thick. The anti-friction layer 230 prevents two substrates 110 from contacting each other during the process which forms the semiconductor and the organic light emitting diode by bonding two substrates 110. That is, it prevents the substrate 110 from being damaged as it prohibits the non-transmissive layer 210 or the magnetic layer formed on the both substrates from contacting each other. This anti-friction layer 230 can be formed of an organic material, an inorganic material or an equivalent thereof. However, the material is not restricted thereto. It is preferable that the anti-friction layer 230 is formed to have a thickness of 10 to 100 μm. If the thickness of the anti-friction layer 230 is 10 μm or below, then the substrates can contact each other, and if the thickness of the anti-friction layer 230 is 100 μm or above, then the substrate 110 is too thick.

Figure 5C:
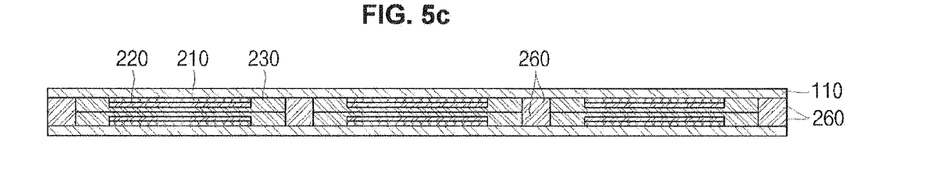

As illustrated in FIG. 5c, in the step of bonding the substrates (S2), two substrates 110, in which the non-transmissive layer 210, the non-transmissive layer 210/magnetic layer 220 or the non-transmissive layer 210/magnetic layer 220/anti-friction layer 230 are formed, are prepared and bonded to each other. In FIG. 5c, the non-transmissive layer 210/magnetic layer 220/anti-friction layer 230 are formed in sequence.

The bonding agent 260 can be applied to the gap between two substrates 110 in order not to separate the two substrates 110. This bonding agent 260 can be formed by using a typical epoxy adhesive, UV-ray setting adhesive or an equivalent thereof. However, the material of the bonding agent is not restricted thereto. The bonding agent 260 can be formed on the edge of the substrate 110 only, or it can be formed on the inner periphery in the form of a plurality of lines to bond the substrate more stably. In FIG. 5c, a plurality of bonding agents 260 are formed between the two substrates 110.

The anti-friction layer 230 can be formed not in the step (S2) of forming the non-transmissive layer 210 but in the step (S3) of bonding the substrates 110. If the anti-friction layer 230 in a liquid form is injected into the gap between two substrates after the two substrates 110 are bonded by applying the bonding agent therein, then it fills the gap by a capillary phenomenon. It is preferable that the anti-friction layer 230 is hardened by heat treating at a certain temperature after the anti-friction layer 230 in a liquid form is formed. It is preferable that the anti-friction layer 230 formed on the both substrates 110 contact each other in the step (S3) of bonding the substrates 110. That is, it is preferable that the anti-friction layers 230 are attached to each other to prevent the substrates 110 from being bent or rubbing each other during the transportation of the bonded substrates 110.

Figure 5D:
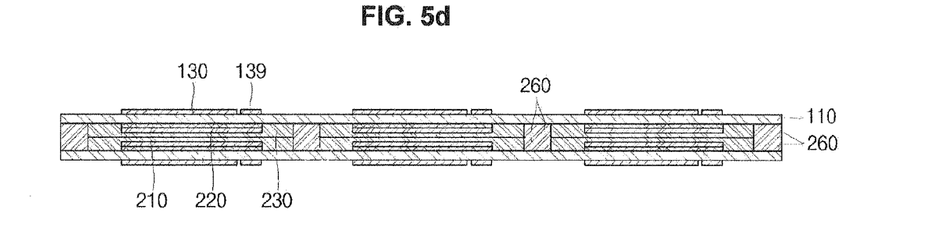

In the step (S4) of forming the semiconductor layer, as illustrated in FIG. 5d, the semiconductor layer 130 is formed on the surface of the bonded substrates 110. The driver circuit 139 can be formed on one side of the semiconductor layer 130. More specifically, the semiconductor layer 130 for driving the organic light emitting display is formed on the surface of the two substrates 110 opposite to the surface in which the anti-friction layer 230 is formed. It is also possible to form the driver circuit 139 on one side of the semiconductor layer 130 and to form the buffer layer (not illustrated in the drawings) on the substrate 110 before the semiconductor layer 130 or the driver circuit 139 is formed. The gate insulating layer, the gate electrode, the inter-layer dielectric layer, the source/drain electrode, the insulating layer (not illustrated in the drawings) and so on are formed after the semiconductor layer 130 is formed. The explanation thereof has been omitted, since it is sufficiently explained above. It is possible to form the pixel defining film after the insulating layer is formed.

The semiconductor layer 130 and the driver circuit 139 can be formed on one side of the substrate, and they can be formed on the other side of the substrate. The semiconductor layer 130 and the driver circuit 139 are formed on one side of the substrate, after that the semiconductor layer 130 and the driver circuit 139 are formed on the other side of the substrate. It is possible to form the semiconductor layer 130 and the driver circuit 139 on one side of the substrate and the other side of the substrate in sequence by flipping the substrate. The semiconductor layer 130 and the driver circuit 139 can be completed by forming them on both sides of the substrate simultaneously, if the processing devices are sufficient.

Figure 5E:
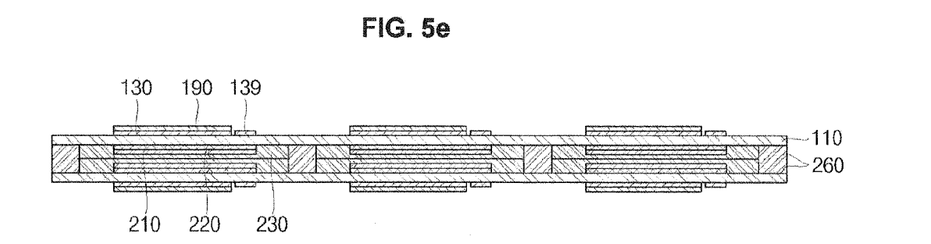

In the step (S5) of forming the organic light emitting diode, as illustrated in FIG. 5e, the organic light emitting diode 190 is formed on the top surface of the semiconductor layer 130. More specifically, the anode, the organic thin layer and the cathode are formed on the insulating layer (not illustrated in the drawings) in sequence. The structure and the forming method of the organic light emitting diode 190 are described above, and thus an explanation thereof has been omitted.

It is possible to form the organic light emitting diode 190 on one side of the substrate and the other side of the substrate. That is, it is possible to complete the organic light emitting diode 190 on one side of the substrate and the organic light emitting diode 190 on the other side of the substrate. It is possible to form the organic light emitting diode 190 on one side of the substrate and the other side of the substrate in sequence by flipping the substrate. The organic light emitting diode 190 can be completed by forming them on both side of the substrate simultaneously, if the processing devices are sufficient.

Figure 5F:
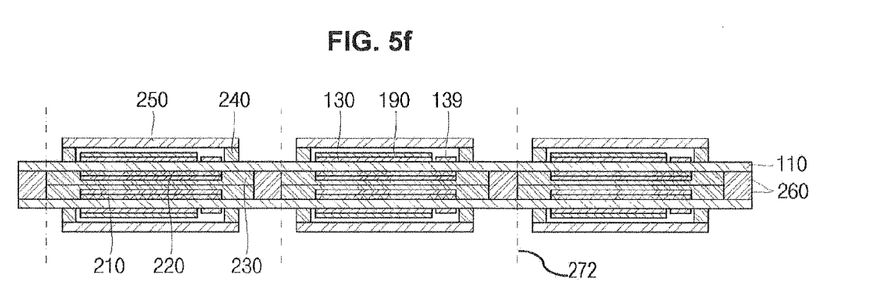

In the step (S6) of gluing the encapsulation substrate, as illustrated in FIG. 5f, the encapsulation substrate 240 is attached on the surface, in which the semiconductor layer 130 and the organic light emitting diode 190 are formed, using the encapsulant 230. The encapsulation substrate 240 can be formed of a transparent glass, a transparent plastic, a transparent polymer or an equivalent thereof. However, the material is not restricted thereto. It is preferable that the encapsulation substrate 240 has a smaller area than that of the bonding agent 260. More specifically, it is possible to saw the edge of the substrate 110 with ease by making the encapsulation substrate 240 smaller than the substrate by 3 to 8 mm from the bonding agent 260. However, the distance from the encapsulation substrate 240 to the bonding agent 260 is not restricted thereto. The encapsulant 230 can be at least one of an epoxy adhesive, a UV-ray setting adhesive, a frit or an equivalent thereof. However, the material is not restricted thereto. If the frit is used as the encapsulant 230, an encapsulating operation can be executed by using a laser beam because the frit must be heated to a predetermined temperature.

The encapsulating process is executed by using the respective encapsulation substrate 240 in each region where the respective semiconductor layer 130, the driver circuit 139 and the organic light emitting diode 190 are formed. However, it is possible to reduce the complexity of the process by executing the process using an integral-type encapsulation substrate.

According to the present invention, the transparent moisture absorption layer can be further formed on the under surface of the encapsulation substrate 240. The transparent moisture absorption layer which is able to absorb moisture without blocking light can be formed on the under surface of the encapsulation substrate 250, since the organic light emitting diode 190 is vulnerable to moisture. This transparent moisture absorption layer is more advantageous as it is getting thicker as long as the transparency is obtained, typically it is preferable that the thickness is of 0.1 to 300 μm. If the thickness of the transparent moisture absorption layer is 0.1 μm or below, sufficient moisture absorption characteristic is not achieved, and if the thickness of the transparent moisture absorption layer is 304 μm or above, there is a risk that it can contact the organic light emitting diode 190. The transparent moisture absorption layer can be made of an alkaline metallic oxide, alkaline earth metallic oxide, metallic halide, metallic sulfate, metallic perchlorate, $P_2O_5$ or an equivalent thereof having an average grain size of 100 nm or below, in particular 20 to 100 nm. However, the material is not restricted thereto.

According to the present invention, moisture can be absorbed by filling up the space between the substrate 110 and the encapsulation substrate 250 with at least one of a layered inorganic substance, polymer, hardening agent or an equivalent thereof, instead of forming the transparent moisture absorption layer on the encapsulation substrate 250. After this filling, the heat treatment process is executed, so that these materials are hardened.

A light reflection effect due to an external light can be prevented by arranging a polarizer film on the surface of the encapsulation substrate 250.

Figure 5G:
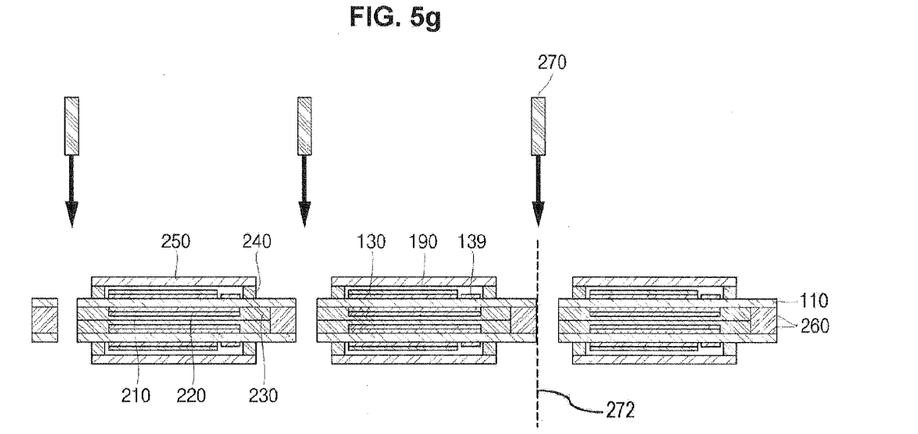

In the step (S7) of sawing, as illustrated in FIG. 5g, the substrate 110 is sawed so that it is divided into the unit organic light emitting display. In the step of sawing, the substrate 110 disposed in the outer periphery of the semiconductor layer 130, the driver circuit 139 and the organic light emitting diode 190. The sawing is achieved by a diamond wheel, a laser beam or an equivalent thereof. However, the sawing method is not restricted thereto. The reference numeral 270 in the drawing is referred to as a laser beam shooter. The laser beam shooter 270 saws the substrate 110 along lines 272.

The sawing process is executed so that the bonding agent 260 remains on at least one side of the substrate 110. In FIG. 5g, the substrate 110 is sawed while the bonding agent 260 remains on the right end of the substrate. The remained bonding agent 260 effects the rigidity of the substrate 110 during the foregoing processes.

Figure 5H:
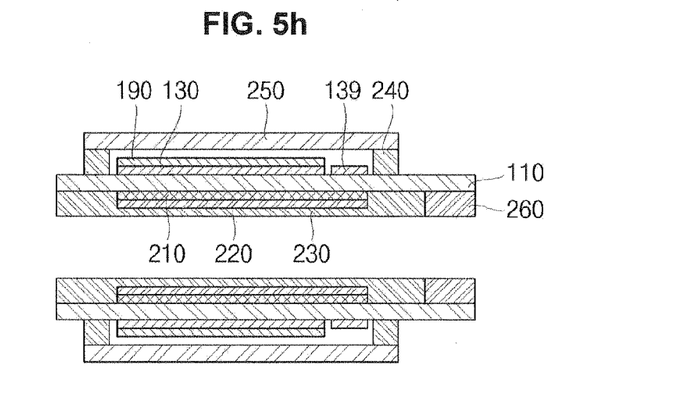

In the step (S8) of separating the substrate, as illustrated in FIG. 5h, two substrates 110, which are completed in the sawing, are separated. The non-transmissive layer 210, the non-transmissive layer 210/magnetic layer 220, the non-transmissive layer 210/magnetic layer 220/anti-friction layer 230 or the non-transmissive layer 210/anti-friction layer 230 as well as the bonding agent 260 are left on the separated substrate 110. In FIG. 5h, the non-transmissive layer 210/magnetic layer 220/anti-friction layer 230 is left on the under surface of the substrate 110.

If the anti-friction layer 230 is formed on the respective substrate 110 before the substrates are bonded, then the separation of the respective substrate 110 is achieved with ease. However, if the anti-friction layer 230 is formed by injecting the liquid anti-friction layer therein after the substrates are bonded, then the separation of the substrate is not achieved easily. Therefore, the anti-friction layer 230 is removed using a chemical solution which dissolves the anti-friction layer 230. It is preferable that the anti-friction layer 230 is made of an organic material which the chemical solution dissolves with ease.

The present invention can be completed by the step of the separation of the substrates 110. After the separation step, it is marketed as the product, after a cell test, Flexible Printed Circuit (FPC) bonding, module test and reliability test have been completed. The cell test can be achieved by forming a region for the cell test on the substrate 110 before the sawing step.

If the separation step of the substrate is chosen as the last process, the non-transmissive layer 210, the non-transmissive layer 210/magnetic layer 220, the non-transmissive layer 210/magnetic layer 220/anti-friction layer 230 or the non-transmissive layer 210/anti-friction layer 230 as well as the bonding agent 260 can be left on the separated substrate 110.

Figure 5I:
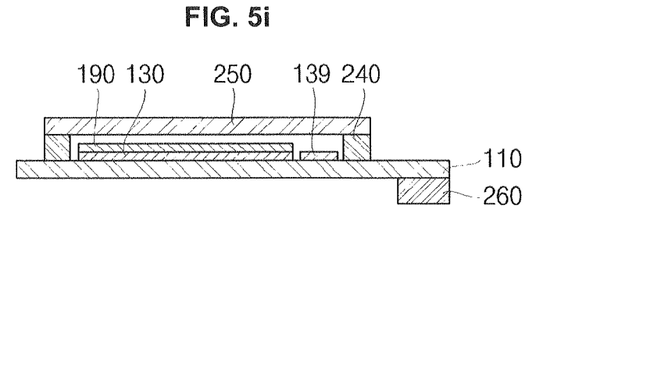

In the step (S9) of removing the non-transmissive layer, as illustrated in FIG. 5i, it is possible to remove the non-transmissive layer 210 by etching or grinding. More specifically, if only the non-transmissive layer 210 is left on the under surface of the substrate 110, then the non-transmissive layer 210 is removed. The non-transmissive layer 210/magnetic layer 220 are left on the under surface of the substrate 110, then it is possible to remove the magnetic layer 220 only or the non-transmissive layer 210/magnetic layer 220. If the non-transmissive layer 210/magnetic layer 220/anti-friction layer 230 are left on the under surface of the substrate 110, then it is possible to remove the anti-friction layer 230 only, or remove the anti-friction layer 230/magnetic layer 220, or remove the non-transmissive layer 210/magnetic layer 220/ anti-friction layer 230 altogether. If the non-transmissive layer 210/anti-friction layer 230 are left on the under surface of the substrate 110, then it is possible to remove the anti-friction layer 230 only, or remove the anti-friction layer 230/ non-transmissive layer 210 together. The rigidity of the substrate 110 is increased, as the bonding agent 260 is still left on one side of the under surface of the substrate 110 after the non-transmissive layer 210 is removed.

Figure 6:
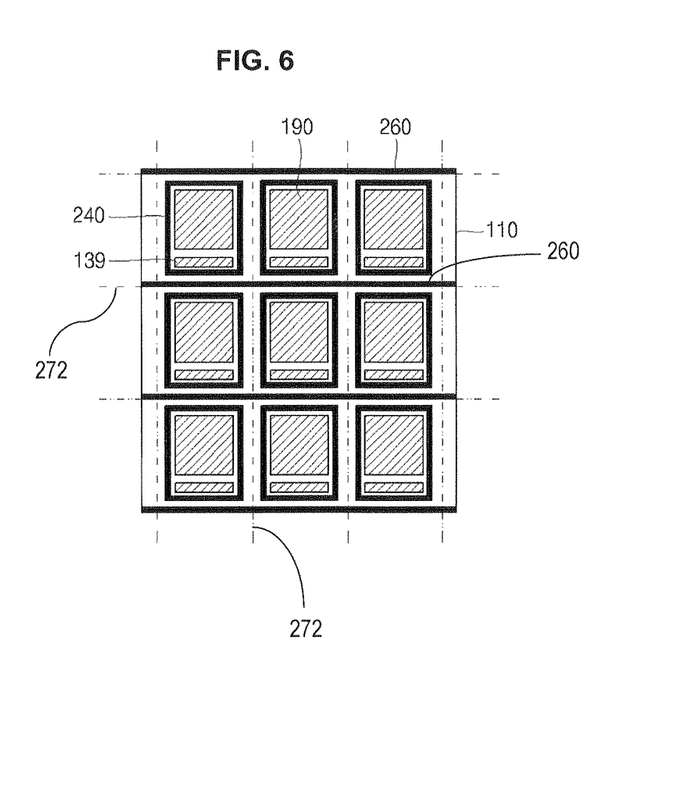
FIG. 6 is a plane view of substrate before sawing which is one method among the fabricating methods of an organic light emitting display according to an embodiment of the present invention.

FIG. 6 is a plane view of a substrate without sawing of a method of fabricating an organic light emitting display according to an embodiment of the present invention.

As illustrated, the organic light emitting diode 190 and the driver circuit 139 are arranged on the substrate 110 in the form of a matrix. The organic light emitting diode 190 and the driver circuit 139 are defined as the unit. The unit is arranged in a 3×3 matrix in FIG. 6. However, the present invention is not limited thereto.

The encapsulant 240 in the form of a square band is formed on the outer periphery of the respective unit. The encapsulation substrate is seated on the encapsulant 240. However, the encapsulation substrate has been omitted in FIG. 6.

The bonding agent 260 is formed on the under surface of the substrate 110 so as to bond with another substrate. This bonding agent 260 can be formed in the horizontal direction. However, the present invention is not restricted to this pattern. The bonding agent 260 can be formed in the vertical direction or a checkerboard.

A two-dot chain line defines the sawing line in the drawings. As illustrated in the drawings, the sawing line can be formed in the shape of a checkerboard. The bonding agent 260 is formed in the horizontal direction along one side of the sawing line.

Therefore, if the sawing is executed according to the sawing line, then the bonding agent 260 with a predetermined thickness is left on one side end of the substrate 110. The position of the bonding agent 260 left on the substrate 110 varies according to the forming position of the bonding agent 260. If the bonding agent 260 is formed along the sawing line with a state that the width of the bonding agent 260 is wider than that of the sawing line, then the bonding agent 260 will remain on every periphery (square periphery) of the sawed substrate 110.

The bonding agent 260 prevents the organic light emitting display from being bent or damaged by reinforcing the rigidity of the organic light emitting display during the fabricating process or in use, as described above.

In accordance with the above description, the organic light emitting display according to the present invention can be easily applied to electronic appliances, such as cellular telephones, Personal Digital Assistants (PDAs), notebook computers, computer monitors and televisions, being made in a thin and compact size, since the organic light emitting display according to the present invention is formed on the substrate having a thickness of 0.05 to 1 mm.

In accordance with the above description, the organic light emitting display according to the present invention prevents UV-rays from influencing the semiconductor layer or the organic light emitting diode through the substrate by forming the non-transmissive layer on the substrate.

In accordance with the above description, the organic light emitting display according to the present invention prevents the substrate from being damaged due to external forces as rigidity is increased by forming the encapsulant on one side of the under surface of the substrate.

The method of fabricating the organic light emitting display according to the present invention can shorten the overall process time by about 50% as the semiconductor process and the organic thin layer process (including cleaning, etching, exposure, development and heat treatment) are executed simultaneously by means of bonding two substrates having a thickness of 0.05 to 1 mm, and prevent the substrate from being bent during the transportation process by obtaining a specific rigidity.

In accordance with the above described ways, the fabricating method according to the present invention prevent UV-rays due to the exposure process from influencing to other substrate in opposite side during of fabricating process by forming the non-transmissive layer on the under surface of the substrate.

In accordance with the above description, the fabricating method according to the present invention prevents the organic light emitting display from being bent or damaged due to the repulsion force between the magnetic layer and the transporting machine transporting the magnetic layer (an another magnetic layer repulsive to the magnetic layer is formed on the transporting machine) or the force of gravity during fabricating process as rigidity is increased by forming the non-transmissive layer/magnetic layer on the under surface of the substrate.

In accordance with the above description, the fabricating method according to the present invention prevents the substrates from contacting each other, and thus, from being damaged by forming the non-transmissive layer/magnetic layer/anti-friction layer or the non-transmissive layer/anti-friction layer on the under surface of the substrate.

The explained hitherto is to be considered in all respects as illustrative and not to restrictive so as to execute the organic light emitting display according to the present invention and the method thereof. That is, the present invention is not restricted to the exemplary embodiments, and it should be understood that the present invention is not limited thereto. Those having ordinary skill in the art will recognize additional modifications, applications, and exemplary embodiments without departing from the scope of the present invention as defined by the following claims.

What is claimed is:

1. A method of fabricating an organic light emitting display device comprising:
    forming a non-transmissive layer on an under surface of each of two substrates;
    bonding the two substrates by applying a bonding agent thereto with the non-transmissive layers face each other;
    forming a semiconductor layer on a respective surface of the bonded substrates opposite to the non-transmissive layer;
    forming an organic light emitting diode on each respective semiconductor layer;
    arranging an encapsulation substrate on a surface of each substrate having the respective light emitting diode formed thereon, by applying an encapsulant to the surface thereof;
    sawing the region of the substrate corresponding to an outer periphery of the encapsulation substrate while leaving the bonding agent on the substrate untouched; and
    separating the two bonded substrates.

2. The method of fabricating an organic light emitting display device as claimed in claim 1, wherein bonding the substrates comprises using one of an epoxy adhesive or a UV-ray setting adhesive as the bonding agent.

3. The method of fabricating an organic light emitting display device as claimed in claim 1, wherein bonding the substrates comprises applying the bonding agent to edges of the substrate.

4. The method of fabricating an organic light emitting display device as claimed in claim 1, wherein bonding the substrates comprises applying the bonding agent to a region of the substrate corresponding to an outer periphery of the semiconductor layer and the organic light emitting diode.

5. The method of fabricating an organic light emitting display device as claimed in claim 1, wherein bonding the substrates comprises applying the bonding agent to a region of the substrate corresponding to an outer periphery of the encapsulant.

6. The method of fabricating an organic light emitting display device as claimed in claim 1, wherein the substrates have a thickness in a range of 0.05 to 1 mm.

7. The method of fabricating an organic light emitting display device as claimed in claim 1, wherein the substrates comprise a glass, plastic, or polymer and steel.

8. The method of fabricating an organic light emitting display device as claimed in claim 1, further comprising forming the non-transmissive layer to have a thickness in a range of 500 to 3000 Å.

9. The method of fabricating an organic light emitting display device as claimed in claim 1, further comprising forming the non-transmissive layer by coating a UV-ray protective agent thereon.

10. The method of fabricating an organic light emitting display device as claimed in claim 1, further comprising forming the non-transmissive layer of one of a metal through which UV-rays are blocked, a transparent UV-ray protective agent, or an opaque UV-ray protective agent.

11. The method of fabricating an organic light emitting display device as claimed in claim 1, further comprising forming the non-transmissive layer of one of Cr, $Cr_2O_3$, Al, Au, Ag, MgO or a silver alloy.

12. The method of fabricating an organic light emitting display device as claimed in claim 1, wherein forming the non-transmissive layer further comprises forming a magnetic layer on the under surface of the substrate.

13. The method of fabricating an organic light emitting display device as claimed in claim 12, wherein forming the non-transmissive layer further comprises forming an anti-friction layer on an under surface of the magnetic layer.

14. The method of fabricating an organic light emitting display device as claimed in claim 1, wherein forming the non-transmissive layer further comprises forming an anti-friction layer on the under surface of the substrate.

15. The method of fabricating an organic light emitting display device as claimed in claim 1, wherein forming the non-transmissive layer further comprises forming an anti-friction layer having a thickness in a range of 10 to 100 μm on the under surface of the substrate.

16. The method of fabricating an organic light emitting display device as claimed in claim 1, wherein forming the non-transmissive layer further comprises forming an anti-friction layer of either an organic material or an inorganic material on the under surface of the substrate.

17. The method of fabricating an organic light emitting display device as claimed in claim 14, wherein bonding the substrates comprises forming anti-friction layers on respective substrates to contact each other.

18. The method of fabricating an organic light emitting display device as claimed in claim 1, wherein attaching the encapsulation substrate comprises forming an area of the encapsulation substrate to be smaller than that of the substrate.

19. The method of fabricating an organic light emitting display device as claimed in claim 1, wherein sawing is performed by a laser beam.

20. The method of fabricating an organic light emitting display device as claimed in claim 1, further comprising removing the non-transmissive layer after separating the substrates.

* * * * *